(12) United States Patent
Hiratani et al.

(10) Patent No.: US 10,806,058 B2
(45) Date of Patent: Oct. 13, 2020

(54) POWER DISTRIBUTION BOARD INCLUDING A BUS BAR WITH RECESS AFFIXED TO HEAT DISSIPATION MEMBER

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Shungo Hiratani, Mie (JP); Kazuyoshi Ohara, Mie (JP); Munsoku O, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/300,105

(22) PCT Filed: May 10, 2017

(86) PCT No.: PCT/JP2017/017765
§ 371 (c)(1),
(2) Date: Nov. 9, 2018

(87) PCT Pub. No.: WO2017/195845
PCT Pub. Date: Nov. 16, 2017

(65) Prior Publication Data
US 2019/0150304 A1    May 16, 2019

(30) Foreign Application Priority Data
May 12, 2016 (JP) .................................. 2016-096277

(51) Int. Cl.
*H05K 7/20* (2006.01)
*H01L 25/18* (2006.01)
(Continued)

(52) U.S. Cl.
CPC ......... *H05K 7/20854* (2013.01); *H01L 23/40* (2013.01); *H01L 25/07* (2013.01);
(Continued)

(58) Field of Classification Search
CPC ...... H05K 7/2089; H05K 7/209; H05K 7/205; H05K 7/20845; H05K 7/20854; H05K 1/0203
(Continued)

(56) References Cited

U.S. PATENT DOCUMENTS 5,852,854 A * 12/1998 Pierrot ................ B29C 44/1228
24/297
9,555,828 B2 * 1/2017 Tashima ............... B62D 5/0406
(Continued)

FOREIGN PATENT DOCUMENTS

JP    2006203977 A  *  8/2006
JP    2011223777 A     11/2011
(Continued)

OTHER PUBLICATIONS

International Search Report, Application No. PCT/JP2017/017765 dated Aug. 15, 2017.

*Primary Examiner* — Zachary Pape
(74) *Attorney, Agent, or Firm* — Honigman LLP

(57) ABSTRACT

Provided is a power distribution board including: a bus bar; and a heat dissipation member that is disposed on one side of the bus bar via an adhesive layer, wherein the bus bar includes a recess that is open to the adhesive layer side, and that is filled with a constituent material of the adhesive layer.

6 Claims, 5 Drawing Sheets

(51) Int. Cl.
*H02G 3/16* (2006.01)
*H05K 5/00* (2006.01)
*H05K 5/03* (2006.01)
*B60R 16/023* (2006.01)
*H05K 7/06* (2006.01)
*H01L 25/07* (2006.01)
*H01L 23/40* (2006.01)

(52) U.S. Cl.
CPC ............... *H01L 25/18* (2013.01); *H02G 3/16* (2013.01); *H05K 5/00* (2013.01); *H05K 5/0069* (2013.01); *H05K 5/03* (2013.01); *H05K 7/06* (2013.01); *H05K 7/20* (2013.01); *B60R 16/0238* (2013.01); *H05K 7/209* (2013.01)

(58) Field of Classification Search
USPC ....... 361/600–678, 679.46–679.54, 688–723
See application file for complete search history.

(56) References Cited

U.S. PATENT DOCUMENTS

| | | | | |
|---|---|---|---|---|
| 10,090,657 | B2* | 10/2018 | Kobayashi | H02G 3/081 |
| 10,194,523 | B2* | 1/2019 | Sumida | H05K 7/1432 |
| 2005/0153583 | A1* | 7/2005 | Kawamura | H01R 9/2458 |
| | | | | 439/76.2 |
| 2006/0027390 | A1* | 2/2006 | Suzuki | H01R 9/226 |
| | | | | 174/68.2 |
| 2008/0274910 | A1 | 11/2008 | Utku | |
| 2017/0047720 | A1* | 2/2017 | Kobayashi | H02G 3/16 |

FOREIGN PATENT DOCUMENTS

| | | | | |
|---|---|---|---|---|
| WO | WO-2015170578 | A1 * | 11/2015 | H02G 3/081 |
| WO | WO-2015174263 | A1 * | 11/2015 | H02G 3/16 |

* cited by examiner

POWER DISTRIBUTION BOARD INCLUDING A BUS BAR WITH RECESS AFFIXED TO HEAT DISSIPATION MEMBER

CROSS-REFERENCE TO RELATED APPLICATIONS

This application is the U.S. national stage of PCT/JP2017/017765 filed May 10, 2017, which claims priority of Japanese Patent Application No. JP 2016-096277 filed May 12, 2016.

TECHNICAL FIELD

The present disclosure relates to a power distribution board.

BACKGROUND

As a power distribution board that is mounted to a vehicle and has the function of switching the supply mode of power between a main battery and a sub-battery, or the function of distributing power from a power supply to various vehicle-mounted electric/electronic components, there is known a board including a circuit assembly including bus bars, and electronic components such as a switching element that are mounted to the circuit assembly.

Since a large current from the power supply flows through the above-described power distribution board, a relatively large amount of heat is generated from the circuit assembly and the electronic components accordingly. For this reason, a heat dissipation member is attached to the circuit assembly, and the generated heat is dissipated from the heat dissipation member (e.g., JP 2003-164039A). JP 2003-164039A discloses a heat dissipation member being bonded to bus bars via an insulating layer and an adhesive layer.

SUMMARY

A power distribution board according to an aspect of the present disclosure includes: a bus bar; and a heat dissipation member that is disposed on one side of the bus bar via an adhesive layer, wherein the bus bar includes a recess that is open to the adhesive layer side, and that is filled with a constituent material of the adhesive layer.

DETAILED DESCRIPTION OF PREFERRED EMBODIMENTS

Figure 1:
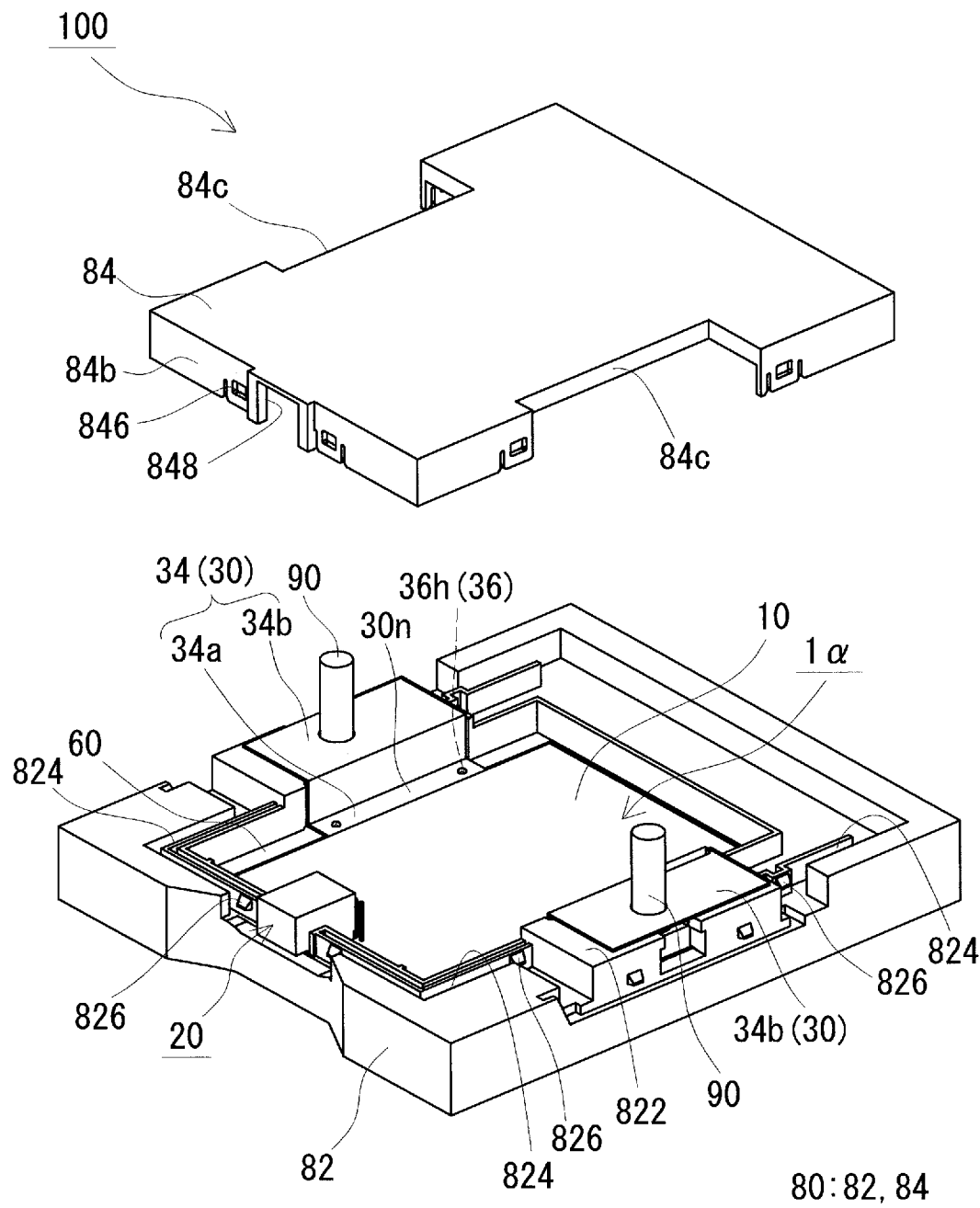
FIG. 1 is a perspective view schematically showing a power distribution board including a substrate unit according to Embodiment 1, with an upper cover removed therefrom.

Problem that is to be Solved by the Disclosure

When an adhesive layer interposed between a bus bar and a heat dissipation member has weak adhesion, the bus bar and the heat dissipation member may be detached from each other.

Therefore, it is an object of the present disclosure to provide a power distribution board having excellent adhesion between the bus bar and the heat dissipation member.

Advantageous Effects of Disclosure

According to the present disclosure, it is possible to provide a power distribution board having excellent adhesion between the bus bar and the heat dissipation member.

DESCRIPTION OF EMBODIMENTS OF THE PRESENT DISCLOSURE

First, embodiments of the present disclosure will be listed and described.

A power distribution board according to an embodiment of the present disclosure includes: a bus bar; and a heat dissipation member that is disposed on one side of the bus bar via an adhesive layer, wherein the bus bar includes a recess that is open to the adhesive layer side, and that is filled with a constituent material of the adhesive layer.

With the above-described configuration, the provision of the recess in the bus bar allows the bus bar and the adhesive layer to be bonded together via the opening edge portion of the recess throughout the inner surface of the recess. That is, the bus bar and the adhesive layer are bonded on a horizontal surface extending along the heat dissipation member, as well as an intersecting surface that intersects the horizontal surface. Accordingly, the adhesion between the bus bar and the heat dissipation member disposed with the adhesive layer interposed therebetween can be increased as compared with when no recess is provided. Therefore, the power distribution board according to the above-described embodiment can exhibit excellent adhesion between the bus bar and the heat dissipation member, even if a large mechanical load is applied to the power distribution board.

In one embodiment of the above-described power distribution board, the recess may be at least one of a through hole that extends from a bonding surface on the adhesive layer side to an opposite surface opposite to the bonding surface; a notch that extends from the bonding surface to the opposite surface, and that reaches to a side surface of the bus bar; and a bottomed-depression (a hole with a bottom) that has an opening in the bonding surface.

When the recess is a through hole, the bus bar and the adhesive layer can be bonded together from the opening edge portion of the bonding surface side of the recess to the opening edge portion on the opposite surface, and the adhesion can be further strengthened by an increased bonding area between the bus bar and the adhesive layer. When the recess is a notch, the bus bar and the adhesive layer can also be bonded together from the opening edge portion on the bonding surface side of the recess to the opening edge portion on the opposite surface side. When the recess is a bottomed-depression, the opposite surface side of the bus bar serves as the bottom surface, the bus bar and the adhesive layer will be bonded together on the side surface (the above-described intersecting surface) and the bottom surface (the above-described horizontal surface) of the recess via the opening edge portion of the recess. Accordingly, the bonding area between the bus bar and the adhesive layer can be increased, and, therefore, the adhesion between the bus bar and the adhesive layer can be further strengthened. When the recess is a bottomed-depression, the conduction region of the bus bar can be more reliably ensured than when the recess is a through hole.

In another embodiment of the above-described power distribution board, the bus bar may include a main portion that is bonded to the adhesive layer, and an extending portion that is molded in one piece with the main portion and that extends from the main portion, and the extending portion may include, on a distal end side thereof, a bolt hole through which a bolt can pass, and includes the recess its the main portion side.

A terminal connected to one end portion of a wire (wire harness) is fixed to the bus bar with a bolt and a nut. When a bolt hole through which the bolt extends is provided on the distal end side of the extending portion, a load is likely to be produced between the main portion side of the extending portion and the adhesive layer by the rotation of the nut. The provision of the recess its the main portion side of the extending portion makes it possible to effectively suppress the reduction of adhesion between the bus bar and the heat dissipation member even if a large mechanical load is applied to the power distribution board as the nut is rotated relative to the bolt.

In another embodiment of the above-described power distribution board in which the bus bar includes an extending portion including a bolt hole, the recess may be provided at a position where a force resulting from rotation of a nut relative to the bolt acts.

When a bolt hole through which a bolt extends is provided on the distal end side of the extending portion, by providing the recess at a position where a force resulting from the rotation of the nut relative to the bolt acts, it is possible to more effectively suppress the reduction in adhesion between the bus bar and the heat dissipation member.

Details of Embodiments of the Present Disclosure

Hereinafter, power distribution boards according to embodiments of the present disclosure will be described with reference to the drawings. In the drawings, the same reference numerals denote the same components. For the sake of convenience of description, the thickness of the adhesive layer and the insulating layer are increased in FIGS. 3 and 5.

Embodiment 1

Figure 2:
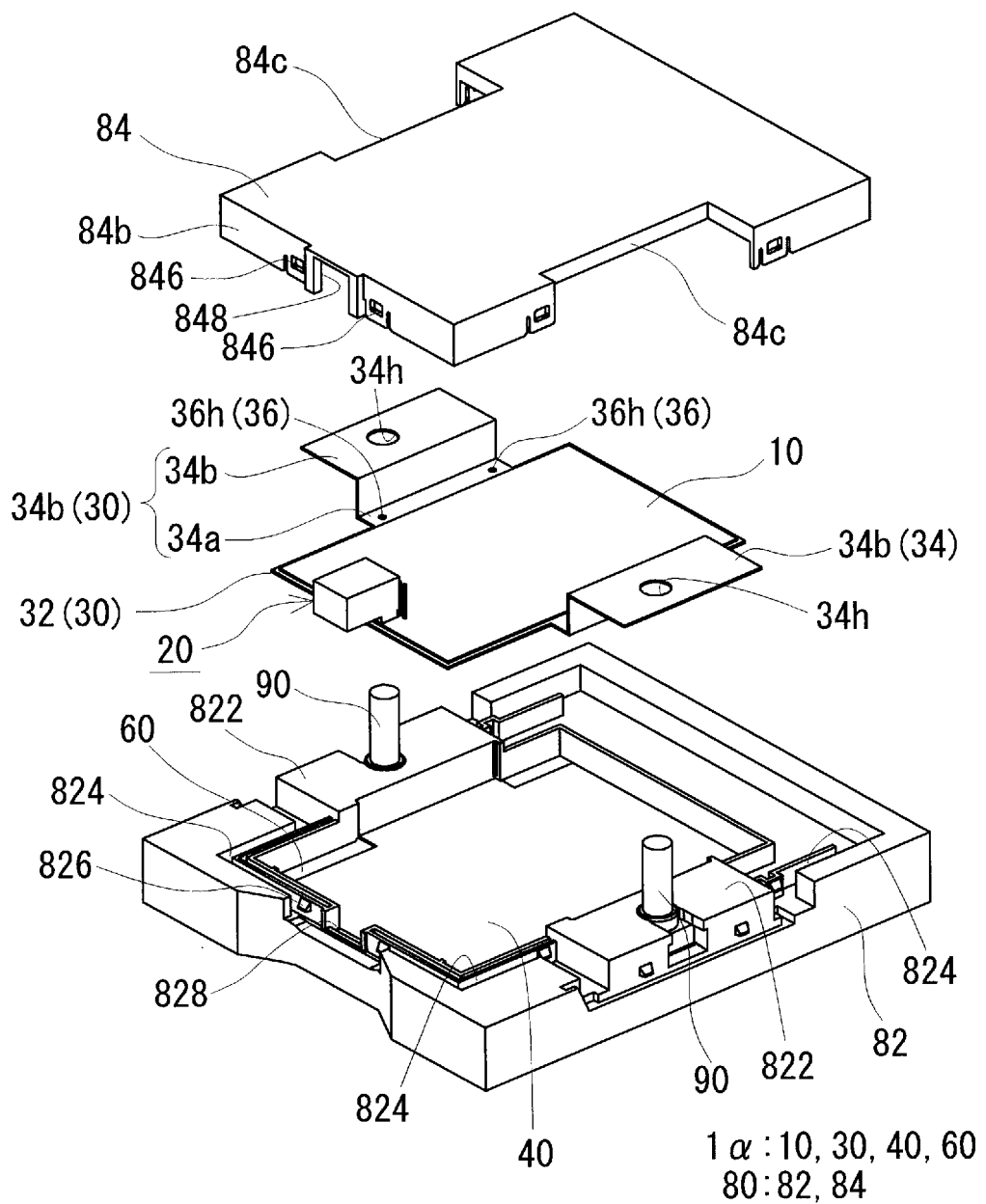
FIG. 2 is an exploded perspective view schematically showing the substrate unit including a power distribution board according to Embodiment 1.
Figure 3:
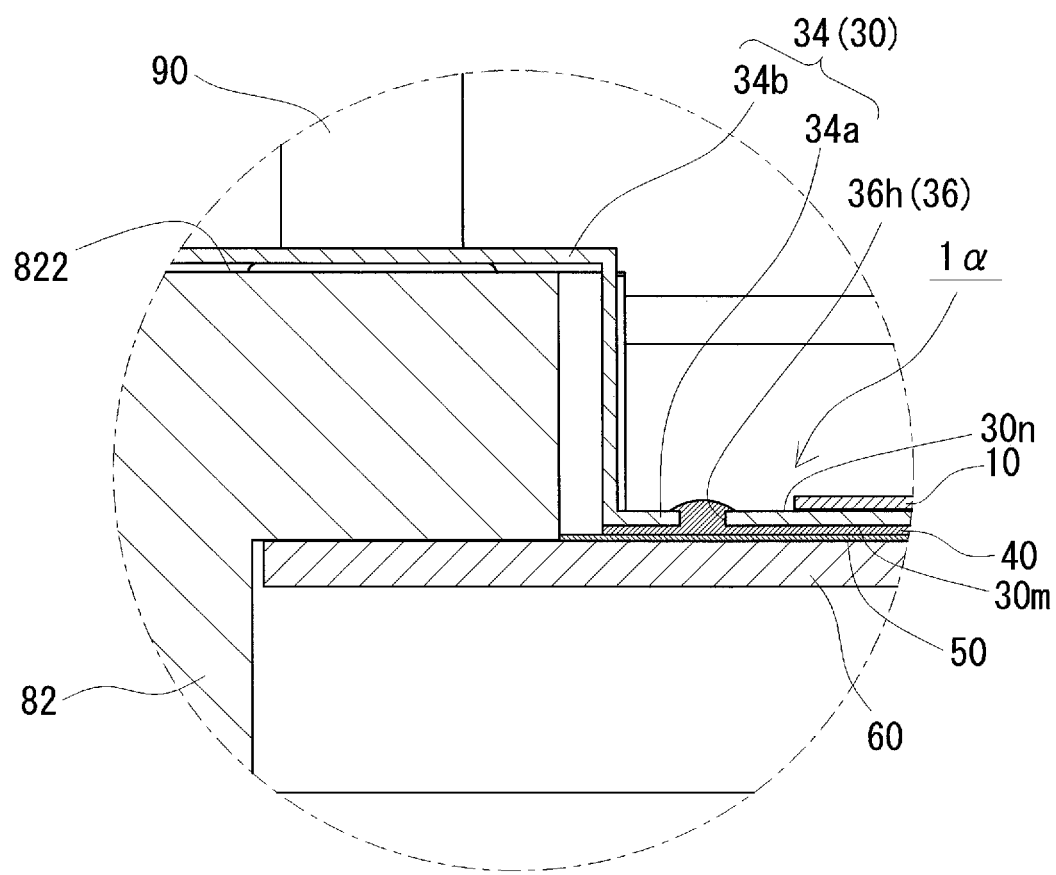
FIG. 3 is an enlarged partial cross-sectional view schematically showing the substrate unit including a power distribution board according to Embodiment 1.

A power distribution board 1α according to Embodiment 1 will be described with reference to FIGS. 1 to 3. The power distribution board 1α is included in a substrate unit 100. The substrate unit 100 is used for switching of the supply of power to vehicle-mounted electric/electronic components in an automobile. In the following, the power distribution board 1α will be described first, and, thereafter, a substrate unit 100 including the power distribution board 1α will be described.
Power Distribution Board The power distribution board 1α includes a circuit assembly including a bus bar 30, and a heat dissipation member 60 that is disposed on one side of the bus bar 30 via an adhesive layer 40. The main feature of the power distribution board 1α according to Embodiment 1 lies in that the bus bar is 30 open to the adhesive layer 40 side, and includes recesses 36 into which the constituent material of the adhesive layer 40 is filled. In the present embodiment, each recess 36 is a through hole 36h extending from a bonding surface 30m (FIG. 3) on the adhesive layer 40 side to an opposite surface 30n (FIGS. 1, 3) opposite to the bonding surface 30m. In the following, each of these components will be described in detail.
Circuit Assembly The circuit assembly includes a circuit board 10, and a bus bar 30 that overlaps the circuit board 10. As shown in FIGS. 1 and 2, the circuit board 10 is a substantially rectangular printed circuit board that is disposed on the bus bar 30, which will be described later, and has a conductive pattern (not shown) formed on its surface opposite to a surface on which the bus bar 30 is disposed. The conductive path constituted by the conductive pattern is a part of a control conductive path (part of the circuit). Electronic components (not shown) such as a switching element and a connector portion 20 are implemented on the circuit board 10. A mating connector portion such as of an external control device (not shown) can be connected to the connector portion 20.
Bus Bar As shown in FIGS. 1 and 2, the bus bar 30 includes a main portion 32 on which the circuit board 10 is disposed, and extending portions 34 that are molded in one piece with the main portion 32, and extend from the main portion 32. The main portion 32 of the bus bar 30 is fixed, for example, via an insulating adhesive or adhesive sheet, to a surface of the circuit board 10 that is opposite to the surface on which the conductive pattern is formed. Accordingly, the circuit board 10 and the bus bar 30 can be handled as one piece. In addition, a heat dissipation member 60, which will be described later, is disposed via the adhesive layer 40 on the main portion 32 of the bus bar 30 on a surface opposite to the surface on which the circuit board 10 is disposed (FIGS. 2 and 3).

Each extending portion 34 of the bus bar 30 is a portion to which an external device is to be electrically connected, and a connection terminal of a wire (wire harness), which is not shown, is electrically connected to the extending portion 34. A bolt hole 34h (FIG. 2) through which a male screw portion 90 extends is formed in each extending portion 34. In the present embodiment, an extending portion 34 is provided from each of two opposing sides of the main portion 32 of the bus bar 30, and a connection terminal of the wire is electrically connected to each of the extending portions 34.

Each extending portion 34 of the bus bar 30 includes a proximal end portion 34a extending along the main portion 32 on the main portion 32 side, and a distal end portion 34b that is bent in a step-like form relative to the proximal end portion 34a on the distal end side. A heat dissipation member 60, which will be described later, is disposed via the adhesive layer 40 on one side (the bonding surface 30m in FIG. 3) of the proximal end portion 34a. That is, the heat dissipation member 60 is disposed via the adhesive layer 40 on the main portion 32 and one side of the proximal end portion 34a of the extending portion 34 of the bus bar 30. Each distal end portion 34b includes a bolt hole 34h through which one of the male screw portions 90 described above extends, and is disposed on a foundation portion 822 of a lower case 82, which will be described later (see FIGS. 1, 3).

Through holes 36h extending from the bonding surface 30m (FIG. 3) on the adhesive layer 40 side to an opposite surface 30n (FIGS. 1, 3) opposite to the bonding surface 30m are formed in the proximal end portion 34a of each extending portion 34. The through holes 36h are open to both of the bonding surface 30m side and the opposite surface 30n side, and are filled with the constituent material of the adhesive layer 40. In the present embodiment, the constituent material of the adhesive layer 40 is filled inside each through hole 36h, from an opening edge portion of the through hole 36h on the bonding surface 30m side to an opening edge portion thereof on the opposite surface 30n side (see FIGS. 1, 3). That is, as shown in FIG. 3, the bus bar 30 and the adhesive layer 40 are bonded together on a horizontal surface along the heat dissipation member 60, as well as on an intersecting surface that intersects the horizontal surface. Accordingly, the bonding area between the bus bar 30 and the adhesive layer 40 can be increased.

Each through hole 36h is preferably provided in a location where a large mechanical load may be applied to the power distribution board 1α. For example, the electrical connection between the bus bar 30 and the connection terminals of the wire described above can be established by passing the male screw portions 90 through the bolt holes formed in the bus bar 30, also passing the male screw portions 90 through bolt holes formed in the connection terminals, and screwing nuts (not shown) to the male screw portions 90. At this time, a mechanical load may be applied to the power distribution board 1α as the nuts are rotated relative to the male screw portions 90. In the present embodiment, the bolt holes 34h are formed in the distal end portions 34b of the extending portions 34 of the bus bar 30, and, therefore, it seems that the above-described mechanical load is likely to be applied to the proximal end portions 34a of the extending portions 34. If a large mechanical load is applied to the proximal end portions 34a, the adhesion between the bus bar 30 and the heat dissipation member 60 may be reduced. Therefore, in the case where the bolt holes 34h are formed in the distal end portions 34b of the extending portions 34, the through holes 36h in the proximal end portions 34a of the extending portions 34 make it possible to suppress the reduction in the adhesion between the bus bar 30 and the heat dissipation member 60 by an increased bonding area between the bus bar 30 the adhesive layer 40, even if the above-described mechanical load is applied to the proximal end portions 34a.

In particular, each through hole 36h is preferably provided in a position where the force resulting from the rotation of the nut relative to the male screw portion 90 acts. In the present embodiment, the proximal end portions 34a each include two through holes 36h, and the through holes 36h are provided in positions having substantially equal distances from the respective bolt holes 34h. One of the two through holes 36h provided in each of the proximal end portions 34a is in a position where a force to fasten the nut acts on the male screw portion 90, and the other is in a position where a force to remove the nut acts on the male screw portion 90.

The shape and the number of through holes 36h can be appropriately selected such that the adhesion achieved by an increased bonding area between the bus bar 30 and the adhesive layer 40 can be increased, and that the formation of the through hole 36h will not affect the conduction region. In the present embodiment, the through holes 36h have a circular cross-sectional shape (see FIGS. 1, 2). However, the through holes 36h may also have an oval or racetrack-like cross-sectional shape, or a polygonal cross-sectional shape such as a rectangular cross-sectional shape. In the present embodiment, the inner circumferential surface of each through hole 36h is perpendicular to the bonding surface 30m (opposite surface 30n) (see FIG. 3). However, apart from this, the inner circumferential surface may also be tapered from the bonding surface 30m (opposite surface 30n) toward the opposite surface 30n (bonding surface 30m). Furthermore, although two through holes 36h are formed in each proximal end portion 34a in the present embodiment (see FIGS. 1, 2), one through hole 36h or three or more through holes 36h may be formed in each proximal end portion 34a.

Heat Dissipation Member

The heat dissipation member 60 dissipates the heat generated from the circuit assembly and the electronic components to the outside. As the heat dissipation member 60, it is possible to use a heat dissipation member obtained, for example, by coating aluminum, copper, an alloy thereof, or another highly heat-conductive onto a metal plate for insulation. The heat dissipation member 60 has a size that allows the heat dissipation member 60 to be disposed on one side of at least the main portion 32 of the bus bar 30 and the proximal end portion 34a of the extending portion 34. In the present embodiment, the heat dissipation member 60 also functions as a bottom plate of a case 80 that houses the circuit assembly (see FIG. 2, the details will be described later).

The heat dissipation member 60 is fixed to the bus bar 30 via the adhesive layer 40. In the present embodiment, an insulating layer 50 is formed on the heat dissipation member 60, then the adhesive layer 40 is formed overlapping the insulating layer 50, and thereafter the bus bar 30 is fixed thereto (see FIG. 3).

As the constituent materials of the adhesive layer 40 and the insulating layer 50, it is preferable to use materials containing an insulating resin, especially, a ceramic filler or the like, and having excellent heat dissipation. Specific examples of the resin include thermosetting resins such as an epoxy resins, a silicone resin, and an unsaturated polyester, and thermoplastic resins such as a polyphenylene sulfide (PPS) resin and a liquid crystal polymer (LCP). As the adhesive layer 40, an adhesive layer formed, for example, by coating or spraying, or a sheet-like adhesive layer may be used.

Substrate Unit

The above-described power distribution board 1α is included in a substrate unit 100. The substrate unit 100 includes a case 80 that houses a circuit assembly. As shown in FIGS. 1 and 2, the case 80 is made up of a lower case 82 and an upper cover 84 that covers the top of the lower case 82. The circuit assembly is housed in an internal space defined by a combination of the lower case 82 and the upper cover 84 with the heat dissipation member 60.

Lower Case

As shown in FIG. 2, the lower case 82 is a rectangular frame, which covers four sides of the outer periphery of the circuit assembly, excluding the distal end portions 34b of the bus bar 30. The heat dissipation member 60 is disposed in one opening (the lower side in FIG. 2) of the lower case 82. That is, the heat dissipation member 60 serves as the bottom plate of the case 80. The lower case 82 includes foundation portions 822 that are provided at a part constituting the frame portion, and on which the distal end portions 34b of the bus bar 30 are placed; an insertion groove 824 that is provided at a part of the upper face other than the foundation portions 822, and in which the upper cover 84 is inserted; and an engaging portion (engaging projection 826) for engagement with the upper cover 84.

A male screw portion 90 is disposed protruding from the upper face of each foundation portion 822. The male screw portion 90 includes a head portion and a shaft portion, and the head portion is fixed to the corresponding foundation portion 822. In the present embodiment, each foundation portion 822 includes a notch into which the head portion of the male screw portion 90 can be inserted from the lateral side, and a fixing portion for fixing the head portion inside the notch. By passing the shaft portions of the male screw portions 90 through the bolt holes 34h formed in the distal end portions 34b of the bus bar 30, placing the distal end portions 34b on the upper faces of the foundation portions 822, and fastening the whole together with the connection terminal (not shown) of the wire by nuts, the bus bar 30 and the external device can be electrically connected.

A side wall portion 84b of the upper cover 84 is inserted into the insertion groove 824. The engaging projection 826 is provided at a suitable location of the lower case 82 in the peripheral direction, and serves to fix the upper cover 84 and the lower case 82, with the side wall portion 84b of the upper cover 84 being inserted in the insertion groove 824, thereby integrating them into one piece.

Upper Cover

As shown in FIG. 2, the upper cover 84 covers the top opening of the lower case 82. The upper cover 84 is formed in a shape that covers the top of the lower case 82 with the foundation portions 822 of the lower case 82 being exposed, and includes cut-out portions 84c at a part of its outer wall. The cut-out portions 84c make it possible to reliably provide gaps through which the distal end portions 34b of the bus bar 30 can be passed even in a state in which the upper cover 84 is fixed to the lower case 82. The gaps allow the distal end portions 34b of the bus bar 30 to be placed on the upper faces of the foundation portions 822. The upper cover 84 includes an engaging hole 846 for engagement with the engaging projection 826 of the lower case 82.

An upper-side recess 848 is provided on the side wall portion 84b of the upper cover 84, a lower-side recess 828 is provided at a position of the lower case 82 that corresponds to the upper-side recess 848, and the connector portion 20 is disposed in an opening defined by the upper-side recess 848 and the lower-side recess 828.

Effects

Since the power distribution board 1α described above includes the through holes 36h in the bus bar 30, the constituent material of the adhesive layer 40 can be filled from the opening edge portions of the through holes 36h on the bonding surface 30m side to the opening edge portions on the opposite surface 30n side. In addition to the bonding between the bus bar 30 and the adhesive layer 40 along the bonding surface 30m, the bonding between the bus bar 30 and the adhesive layer 40 in the direction intersecting the bonding surface 30m can increase the bonding area between the bus bar 30 and the adhesive layer 40. By this increased bonding area between the bus bar 30 and the adhesive layer 40, it is possible to increase the adhesion between the bus bar 30 and the heat dissipation member 60 via the adhesive layer 40.

In particular, by increasing the adhesion between the bus bar 30 and the adhesive layer 40 in locations where a large load may be applied to the power distribution board 1α, for example, a location where the force resulting from the rotation of the nut relative to the male screw portion 90 is likely to act, it is possible to effectively inhibit the bus bar 30 and the heat dissipation member 60 from being detached from each other by the above-described load.

Usage

The above-described power distribution board can be suitably applied as a component of substrate units used for large-current power control units such as a DC voltage converter, an AC/DC converter, and a DC/AC inverter that are mounted on vehicles such as an automobile.

Embodiment 2

Figure 4:
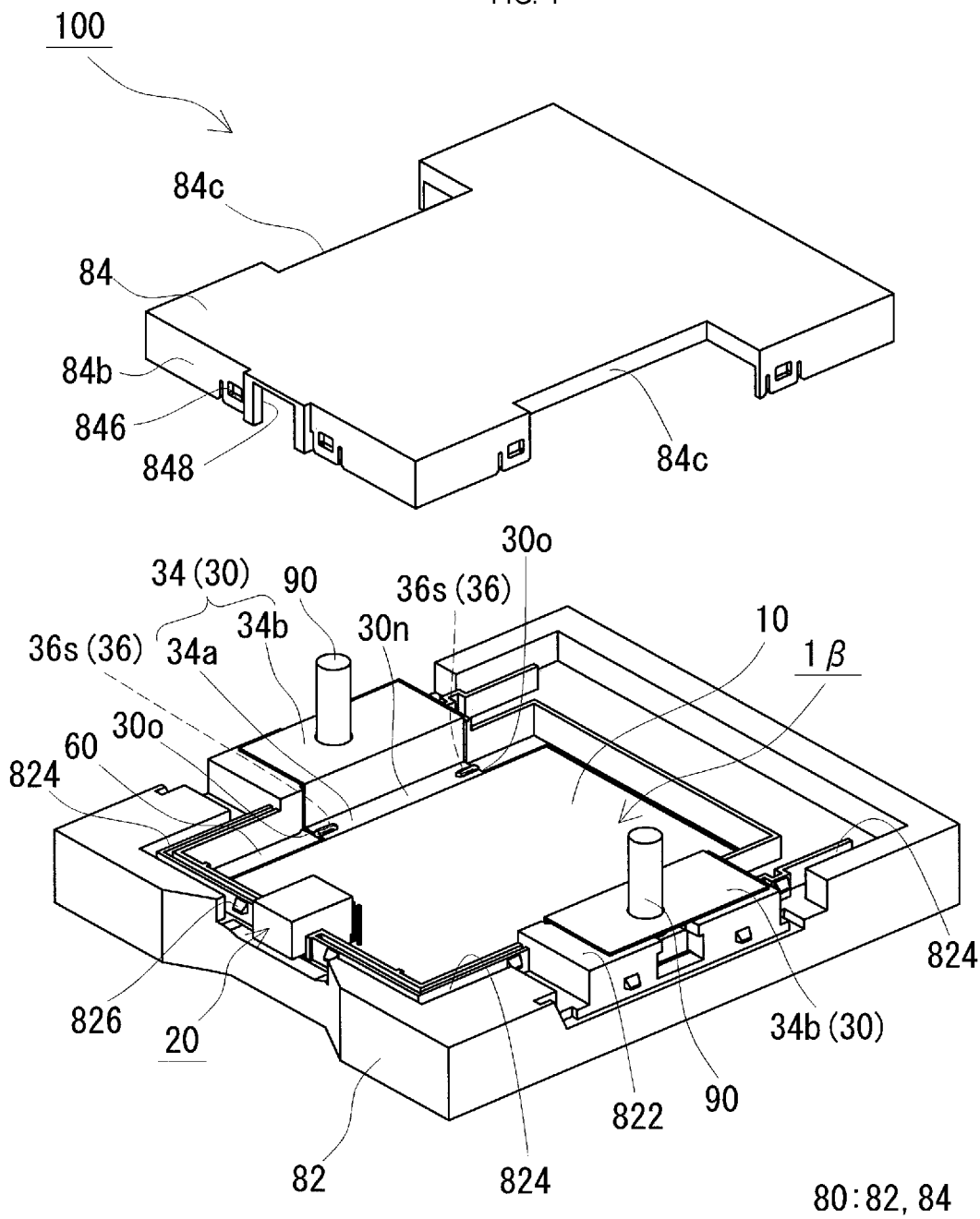
FIG. 4 is a perspective view schematically showing a substrate unit including a power distribution board according to Embodiment 2, with an upper cover removed therefrom.

In Embodiment 2, a description will be given of a configuration in which the recesses 36 are notches (slits 36s) that extend through the bonding surface 30m (see FIG. 3) and the opposite surface 30n, and reach to a side surface 30o of the bus bar 30, as shown in FIG. 4. A power distribution board 1β as shown in FIG. 4 is in a state in which the distal end portions 34b of the bus bar 30 are placed on the foundation portions 822 of the lower case 82. A power distribution board is according to Embodiment 2 differs from Embodiment 1 in that the recesses 36 are formed as slit 36s, but the rest of the configuration is the same as that of Embodiment 1. Each slit 36s is open to both the bonding surface 30m side and the opposite surface 30n side of the bus bar 30, and is also open to the side surface 30o side. Since the recesses 36 are slits 36s, the adhesion between the bus bar 30 and the adhesive layer 40 can be increased by an increased bonding area. In the present embodiment, each slit 36s has an elongated rectangular shape extending from the central side of the corresponding proximal end portion 34a to the side surface 30o.

Embodiment 3

Figure 5:
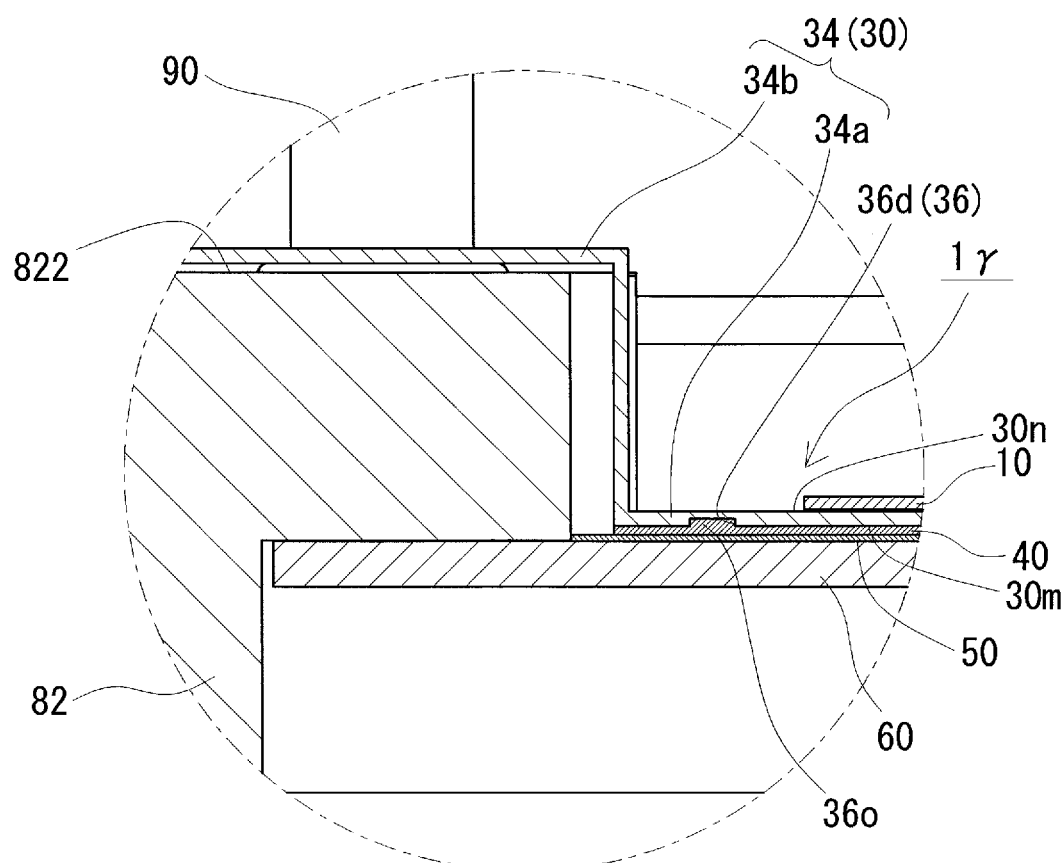
FIG. 5 is an enlarged partial cross-sectional view schematically showing a substrate unit including a power distribution board according to Embodiment 3.

In Embodiment 3, a description will be given of a configuration in which the recesses 36 are bottomed-depressions (groove portions 36d) each having an opening 36o to the bonding surface 30m, as shown in FIG. 5. A power distribution board 1y as shown in FIG. 5 is in a state in which the distal end portions 34b of the bus bar 30 are placed on the foundation portions 822 of the lower case 82. The power distribution board 1y according to Embodiment 3 differs from Embodiment 1 in that the recesses 36 are formed as the groove portions 36d, but the rest of the configuration is the same as that of Embodiment 1. The groove portions 36d do not extend through the bonding surface 30m and the opposite surface 30n of the bus bar 30, and have a bottom surface on the opposite surface 30n side. Since the recesses 36 are the groove portions 36d, the bus bar 30 and the adhesive layer 40 are bonded on the side surface and the bottom surface of each of the groove portions 36d. Accordingly, the bonding area between the bus bar 30 and the adhesive layer 40 can be increased, and, therefore, the adhesion between the bus bar 30 and the heat dissipation member 60 via the adhesive layer 40 can be further increased. Although each opening 36o has a circular shape in the present embodiment, the opening 36o may also have an oval or racetrack-like shape, or a polygonal shape such as a rectangular shape. Alternatively, the opening 36o may also be formed as a groove portion extending all the way to the side surface of the bus bar 30.

The present disclosure is defined by the claims, rather than being limited to the above-described examples, and intended to include all modifications which fall within the scope of the claims and the meaning and scope of equivalents thereof. For example, the size, the shape, and the number of recesses, the formation location of recesses, and the like may be changed. When a plurality of recesses are provided, each of the recesses may be at least one of a through hole, a slit, and a groove portion, or may be a combination of a through hole and a slit, a combination of a through hole and a groove portion, a combination of a slit and a groove portion, or a combination of a through hole, a slit, and a groove portion.

The invention claimed is:

1. A power distribution board comprising:
   a bus bar;
   and a heat dissipation member that is disposed on one side of the bus bar via an adhesive layer, wherein the bus bar includes a recess that is open to the adhesive layer side, and that is filled with a constituent material of the adhesive layer, wherein the adhesive layer forms a bead extending beyond a top surface of the bus bar wherein the recess is provided at a position where a force resulting from rotation of a nut relative to the bolt acts.

2. The power distribution board according to claim 1, wherein the recess is a notch that extends from a bonding surface to an opposite surface, and that reaches to a side surface of the bus bar.

3. The power distribution board according to claim 2, wherein the bus bar includes a main portion that is bonded to the adhesive layer, and an extending portion that is molded in one piece with the main portion and that extends from the main portion, and the extending portion includes, on a distal end side thereof, a bolt hole through which a bolt can pass, and includes the recess on the main portion side.

4. The power distribution board according to claim 1, wherein the bus bar includes a main portion that is bonded to the adhesive layer, and an extending portion that is molded in one piece with the main portion and that extends from the main portion, and the extending portion includes, on a distal end side thereof, a bolt hole through which a bolt can pass, and includes the recess on the main portion side.

5. The power distribution board according to claim 1, wherein a portion of the bead bounds a peripheral edge of the upper surface of the bus bar opposite the adhesive layer side.

6. A power distribution board comprising:
   a bus bar;
   and a heat dissipation member that is disposed on one side of the bus bar via an adhesive layer, wherein the bus bar includes a recess that is open to the adhesive layer side, and that is filled with a constituent material of the adhesive layer, wherein the recess is a bottomed depression that has an opening in the bonding surface.

* * * * *